(12) United States Patent
Xu et al.

(10) Patent No.: US 11,342,540 B2
(45) Date of Patent: May 24, 2022

(54) AMOLED DISPLAY PANEL THAT INCLUDES A DIFFUSION FILM, DISPLAY PANEL PRODUCTION METHOD, AND DISPLAY APPARATUS

(71) Applicant: Huawei Technologies Co., Ltd., Shenzhen (CN)

(72) Inventors: Gang Xu, Shenzhen (CN); Kaiyuan Ko, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 362 days.

(21) Appl. No.: 16/480,563

(22) PCT Filed: Jan. 24, 2017

(86) PCT No.: PCT/CN2017/072506
§ 371 (c)(1),
(2) Date: Jul. 24, 2019

(87) PCT Pub. No.: WO2018/137151
PCT Pub. Date: Aug. 2, 2018

(65) Prior Publication Data
US 2019/0355937 A1 Nov. 21, 2019

(51) Int. Cl.
*H01L 51/52* (2006.01)
*H01L 27/32* (2006.01)
*H01L 51/56* (2006.01)

(52) U.S. Cl.
CPC ........ *H01L 51/5284* (2013.01); *H01L 27/322* (2013.01); *H01L 51/56* (2013.01); *H01L 27/3244* (2013.01)

(58) Field of Classification Search
CPC ... H01L 51/5284; H01L 27/322; H01L 51/56; H01L 27/3244; H01L 51/5281; H01L 21/77; H01L 27/32
See application file for complete search history.

(56) References Cited

U.S. PATENT DOCUMENTS

2004/0239240 A1 12/2004 Kato
2007/0132921 A1 6/2007 Yoon
(Continued)

FOREIGN PATENT DOCUMENTS

CN 1610471 A 4/2005
CN 1979229 A 6/2007
(Continued)

OTHER PUBLICATIONS

Wikipedia, "Holography" XP002796324, Retrieved from the Internet: URL:https://en.wikipedia.org/wiki/Holography, Mar. 13, 2015, 21 pages.
(Continued)

*Primary Examiner* — Selim U Ahmed
(74) *Attorney, Agent, or Firm* — Conley Rose, P.C.

(57) ABSTRACT

A display panel includes an AMOLED light-emitting board and a light filter layer disposed on a cathode surface of the AMOLED light-emitting board. The light filter layer includes a color light filter and a diffusion film. The color light filter includes a red light filter component, a green light filter component, a blue light filter component, and a BM. The diffusion film is disposed on a surface of the color light filter, or is disposed on each light filter component in the color light filter. The diffusion film is configured to enable ambient light passing through the diffusion film to be incident on the cathode surface of the AMOLED light-emitting board in a direction that is not perpendicular to the cathode surface of the AMOLED light-emitting board.

20 Claims, 9 Drawing Sheets

(56) References Cited

U.S. PATENT DOCUMENTS

| | | |
|---|---|---|
| 2008/0042146 A1 | 2/2008 | Cok et al. |
| 2008/0252832 A1 | 10/2008 | Nieuwkerk et al. |
| 2008/0284943 A1 | 11/2008 | Jeong et al. |
| 2011/0042346 A1 | 2/2011 | Yoon |
| 2013/0320842 A1 | 12/2013 | Park et al. |
| 2014/0110690 A1 | 4/2014 | Yagi et al. |
| 2015/0340412 A1 | 11/2015 | Lee et al. |
| 2016/0087247 A1 | 3/2016 | Kim |
| 2016/0254483 A1 | 9/2016 | Wang |
| 2016/0334553 A1 | 11/2016 | Wu et al. |
| 2016/0380239 A1 | 12/2016 | Xu |
| 2020/0058888 A1* | 2/2020 | Sugiyama ............ H01L 51/5265 |

FOREIGN PATENT DOCUMENTS

| | | |
|---|---|---|
| CN | 101283308 A | 10/2008 |
| CN | 101308282 A | 11/2008 |
| CN | 103376483 A | 10/2013 |
| CN | 104009062 A | 8/2014 |
| CN | 104112764 A | 10/2014 |
| CN | 104538427 A | 4/2015 |
| CN | 104952791 A | 9/2015 |
| CN | 105097869 A | 11/2015 |
| CN | 105629544 A | 6/2016 |
| EP | 2894672 A1 | 7/2015 |
| JP | 2004319100 A | 11/2004 |
| JP | 2007156405 A | 6/2007 |
| JP | 2007213824 A | 8/2007 |
| JP | 2009510513 A | 3/2009 |
| JP | 2010186117 A | 8/2010 |
| JP | 2013205510 A | 10/2013 |
| JP | 2014071188 A | 4/2014 |
| JP | 2014086286 A | 5/2014 |
| KR | 20130134919 A | 12/2013 |

OTHER PUBLICATIONS

Machine Translation and Abstract of Chinese Publication No. CN103376483, Oct. 30, 2013, 14 pages.

Machine Translation and Abstract of Chinese Publication No. CN104538427, Apr. 22, 2015, 15 pages.

Machine Translation and Abstract of Chinese Publication No. CN105629544, Jun. 1, 2016, 12 pages.

Foreign Communication From A Counterpart Application, PCT Application No. PCT/CN2017/072506, English Translation of International Search Report dated Oct. 18, 2017, 2 pages.

Foreign Communication From A Counterpart Application, PCT Application No. PCT/CN2017/072506, English Translation of Written Opinion dated Oct. 18, 2017, 4 pages.

* cited by examiner

Dispose a light filter layer on a surface of a substrate. The light filter layer includes a color light filter and a diffusion film. The color light filter includes a red light filter component transmitting red light, a green light filter component transmitting green light, a blue light filter component transmitting blue light, and a black matrix BM. The diffusion film is disposed on a surface of the color light filter, or the diffusion film is disposed on each light filter component in the color light filter, so that ambient light is reflected by a cathode surface of an AMOLED light-emitting board to the BM or a light filter component that has a different color from a light filter component through which the ambient light passes — S101

Etch another surface of the substrate to slim down a thickness of the substrate to a preset first thickness — S102

Attach the etched another surface of the substrate to a surface of a protection board — S103

Attach another surface of the protection board to the cathode surface of the AMOLED light-emitting board — S104

FIG. 12

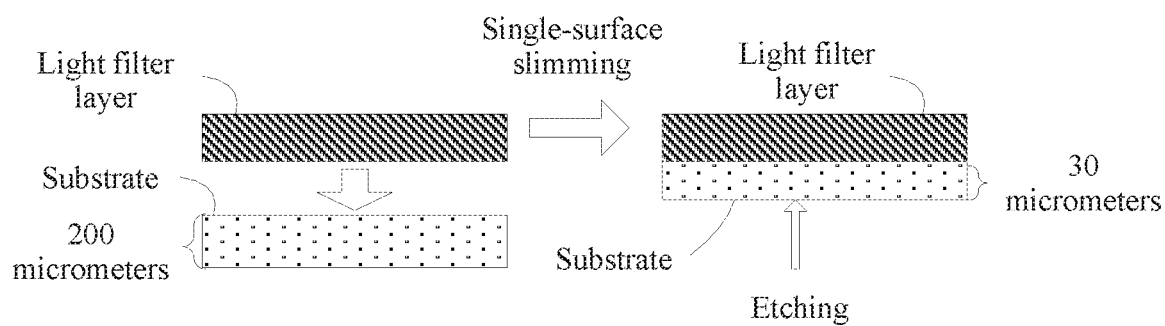

FIG. 13

```
┌─────────────────────────────────────────────────────────────────┐
│ Dispose a light filter layer on a surface of a substrate. The   │
│   light filter layer includes a color light filter and a        │
│   diffusion film. The color light filter includes a red light   │
│   filter component transmitting red light, a green light        │
│   filter component transmitting green light, a blue light       │── S101
│   filter component transmitting blue light, and a black matrix  │
│   BM. The diffusion film is disposed on a surface of the color  │
│   light filter, or the diffusion film is disposed on each light │
│   filter component in the color light filter, so that ambient   │
│   light is reflected by a cathode surface of an AMOLED light-   │
│   emitting board to the BM or a light filter component that     │
│   has a different color from a light filter component through   │
│   which the ambient light passes                                │
└─────────────────────────────────────────────────────────────────┘
                              │
                              ▼
┌─────────────────────────────────────────────────────────────────┐
│  Attach a surface of an upper cover to the light filter layer    │── S105
└─────────────────────────────────────────────────────────────────┘
                              │
                              ▼
┌─────────────────────────────────────────────────────────────────┐
│ Etch another surface of the upper cover to slim down a          │── S106
│ thickness of the upper cover to a preset second thickness       │
└─────────────────────────────────────────────────────────────────┘
                              │
                              ▼
┌─────────────────────────────────────────────────────────────────┐
│ Etch another surface of the substrate to slim down a thickness  │── S102
│ of the substrate to a preset first thickness                    │
└─────────────────────────────────────────────────────────────────┘
                              │
                              ▼
┌─────────────────────────────────────────────────────────────────┐
│ Attach the etched another surface of the substrate to a         │── S103
│ surface of a protection board                                   │
└─────────────────────────────────────────────────────────────────┘
                              │
                              ▼
┌─────────────────────────────────────────────────────────────────┐
│ Attach another surface of the protection board to the cathode   │── S104
│ surface of the AMOLED light-emitting board                      │
└─────────────────────────────────────────────────────────────────┘
```

FIG. 14

AMOLED DISPLAY PANEL THAT INCLUDES A DIFFUSION FILM, DISPLAY PANEL PRODUCTION METHOD, AND DISPLAY APPARATUS

CROSS-REFERENCE TO RELATED APPLICATIONS

This application is a national stage application of International Application No. PCT/CN2017/072506, filed on Jan. 24, 2017, which is hereby incorporated by reference in its entirety.

TECHNICAL FIELD

Embodiments of the present invention relate to the field of optoelectronic technologies, and in particular, to a display panel, a display panel production method, and a display apparatus.

BACKGROUND

An active matrix organic light-emitting diode (Active Matrix Organic Light-Emitting Diode, AMOLED) display panel is a display panel that can autonomously emit light without a backlight source. The display panel is light, thin, and bendable, and can meet requirements of a foldable tablet computer, a flexible watch, and a display requiring a flexible screen.

A current AMOLED display panel may be shown in FIG. 1, including a substrate 01, a color light filter 02, an AMOLED light-emitting board 03, and a protection board 04, The AMOLED light-emitting board 03 includes a base 031, an anode layer 032, a cathode layer 030, and an organic light-emitting component 033 between the anode layer 032 and the cathode layer 030. When a voltage is applied to the anode layer 032 and the cathode layer 030, the organic light-emitting component 033 emits red light, green light, and blue light of different intensity based on a value of the voltage. Light filter components of corresponding colors in the color light filter 02 are above pixels in the organic light-emitting component 033 that emit the red light, the green light, and the blue light. The light filter component can transmit light that has a same color as the light filter component, and absorb light that has a different color from the light filter component. Therefore, the light filter component causes no light intensity loss to light emitted by a pixel that has a same color as the light filter component, but absorbs light energy of ambient light incident on the display panel, reducing incidence of the ambient light.

A red light filter component (represented by R in the light filter 02 in FIG. 1) in FIG. 1 is used as an example. When ambient light (light represented by a solid line arrow in FIG. 1) is perpendicularly incident on the display panel, red light in the ambient light penetrates the red light filter component and enters the display panel, and light of other colors is filtered out by the red light filter component. To be specific, after the ambient light passes through the red light filter component, light intensity is reduced to approximately 33%. When the light arrives at the cathode layer 030 of the AMOLED light-emitting board 03, the cathode layer 030 of the AMOLED light-emitting board 03 reflects the red light with reflectivity of 80% because the cathode layer 030 is a metal. In this case, light intensity (reflected light represented by a dashed line arrow in FIG. 1) of approximately 27% (a product of 33% and 80%) of the ambient light is reflected by the red light filter component, increasing dark state brightness (brightness of a region corresponding to a nonluminous pixel in the AMOLED light-emitting board, or brightness of a region corresponding to a pixel emitting light of relatively low light intensity in the AMOLED light-emitting board) of the display panel in a bright environment with light. Consequently, a contrast of the display panel in the bright environment decreases.

SUMMARY

Embodiments of the present invention provide a display panel, a display panel production method, and a display apparatus, to reduce reflection of ambient light incident on the display panel, and increase a contrast of the display panel in a bright environment.

The following technical solutions are used in the embodiments of the present invention to achieve the foregoing objective.

According to a first aspect, an embodiment of the present invention provides a display panel, including an AMOLED light-emitting board and a light filter layer disposed on a cathode surface of the AMOLED light-emitting board, where the light filter layer includes a color light filter and a diffusion film; the color light filter includes a red light filter component transmitting red light, a green light filter component transmitting green light, a blue light filter component transmitting blue light, and a black matrix BM; the diffusion film is disposed on a surface of the color light filter, or the diffusion film is disposed on each light filter component in the color light filter; and the diffusion film is configured to enable ambient light passing through the diffusion film to be incident on the cathode surface of the AMOLED light-emitting board in a direction that is not perpendicular to the cathode surface of the AMOLED light-emitting board, so that the ambient light is reflected by the cathode surface of the AMOLED light-emitting board to the BM or a light filter component that has a different color from a light filter component through which the ambient light passes.

Based on the display panel provided in this embodiment of the present invention, the diffusion film is disposed on the color light filter, so that after passing through the diffusion film, the ambient light incident on the display panel can be scattered in a direction that is not perpendicular to the AMOLED display panel. In this case, the ambient light is incident on the cathode surface of the AMOLED light-emitting board of the display panel from a specific scattering angle instead of being perpendicularly incident on the cathode surface of the AMOLED light-emitting board, so that the ambient light is reflected by the cathode surface of the AMOLED light-emitting board to the BM or the light filter component that has a different color from the light filter component through which the ambient light passes. A light filter component in the color light filter can transmit only light that has a same color as the light filter component and absorb light that has a different color from the light filter component, and the BM is not transparent. Therefore, when the ambient light is reflected to the BM or the light filter component that has a different color from the light filter component through which the ambient light passes when being incident on the display panel, the ambient light can be absorbed by the BM or the light filter component of the different color, reducing reflection of the ambient light incident on the display panel, and increasing a contrast of the display panel in a bright environment.

In a possible design, the diffusion film is a holographic diffusion film.

In this possible design, a scattering effect of perpendicularly incident ambient light is improved by using an anisotropic diffusion film.

In a possible design, the display panel further includes a substrate and a protection board that are located between the cathode surface of the AMOLED light-emitting board and the color light filter; the color light filter is disposed on a surface of the substrate, another surface of the substrate is attached to a surface of the protection board, and another surface of the protection board is attached to the cathode surface of the AMOLED light-emitting board; and a sum of a thickness of the protection board and a thickness of the substrate ranges from 0.1 millimeter to 0.3 millimeter.

In a possible design, the display panel further includes a substrate located on a surface of the light filter layer and a protection board located between another surface of the light filter layer and the cathode surface of the AMOLED light-emitting board; and a thickness of the protection board ranges from 0.1 millimeter to 0.3 millimeter.

In the foregoing two possible designs, a distance d between the color light filter and the cathode surface of the AMOLED light-emitting board is designed to range from 0.1 millimeter to 0.3 millimeter, to ensure that a thickness of the display panel is relatively small.

In a possible design, materials of the substrate and the protection board are glass.

According to a second aspect, an embodiment of the present invention provides a display apparatus, including the display panel according to any one of the first aspect and the possible designs of the first aspect.

In the display apparatus provided in this embodiment of the present invention, a diffusion film is disposed on a color light filter of a display panel in the display apparatus, so that after passing through the diffusion film, ambient light incident on the display panel can be scattered in a direction that is not perpendicular to the AMOLED display panel. In this case, the ambient light is incident on a cathode surface of an AMOLED light-emitting board of the display panel from a specific scattering angle instead of being perpendicularly incident on the cathode surface of the AMOLED light-emitting board, so that the ambient light is reflected by the cathode surface of the AMOLED light-emitting board to a BM or a light filter component that has a different color from a light filter component through which the ambient light passes. A light filter component in the color light filter can transmit only light that has a same color as the light filter component and absorb light that has a different color from the light filter component, and the BM is not transparent, Therefore, when the ambient light is reflected to the BM or the light filter component that has a different color from the light filter component through which the ambient light passes when being incident on the display panel, the ambient light can be absorbed by the BM or the light filter component of the different color, reducing reflection of the ambient light incident on the display panel, and increasing a contrast of the display panel in a bright environment.

According to a third aspect, an embodiment of the present invention provides a display panel production method, and the method includes: disposing a light filter layer on a surface of a substrate, where the light filter layer includes a color light filter and a diffusion film, and the color light filter includes a red light filter component transmitting red light, a green light filter component transmitting green light, a blue light filter component transmitting blue light, and a black matrix BM; the diffusion film is disposed on a surface of the color light filter, or the diffusion film is disposed on each light filter component in the color light filter; and the diffusion film is configured to enable ambient light passing through the diffusion film to be incident on a cathode surface of an AMOLED light-emitting board in a direction that is not perpendicular to the cathode surface of the AMOLED light-emitting board, so that the ambient light is reflected by the cathode surface of the AMOLED light-emitting board to the BM or a light filter component that has a different color from a light filter component through which the ambient light passes; etching another surface of the substrate to slim down a thickness of the substrate to a preset first thickness; attaching the etched another surface of the substrate to a surface of the protection board, where a sum of a thickness of the protection board and the first thickness ranges from 0.1 millimeter to 0.3 millimeter; and attaching another surface of the protection board to the cathode surface of the AMOLED light-emitting board.

Based on the display panel production method provided in this embodiment of the present invention, after the light filter layer is disposed on the surface of the substrate, the thickness of the substrate is slimmed down to the first thickness by etching the another surface of the substrate. Then the etched another surface of the substrate is attached to the surface of the protection board, and the another surface of the protection board is attached to the cathode surface of the AMOLED light-emitting board, to obtain a display panel. The diffusion film is disposed on the color light filter in the light filter layer, so that after passing through the diffusion film, the ambient light incident on the display panel can be scattered in a direction that is not perpendicular to the AMOLED display panel. In this case, the ambient light is incident on the cathode surface of the AMOLED light-emitting board of the display panel from a specific scattering angle instead of being perpendicularly incident on the cathode surface of the AMOLED light-emitting board, so that the ambient light is reflected by the cathode surface of the AMOLED light-emitting board to the BM or the light filter component that has a different color from the light filter component through which the ambient light passes. A light filter component in the color light filter can transmit only light that has a same color as the light filter component and absorb light that has a different color from the light filter component, and the BM is not transparent. Therefore, when the ambient light is reflected to the BM or the light filter component that has a different color from the light filter component through which the ambient light passes when being incident on the display panel, the ambient light can be absorbed by the BM or the light filter component of the different color, reducing reflection of the ambient light incident on the display panel, and increasing a contrast of the display panel in a bright environment.

In a possible design, before the attaching the etched another surface of the substrate to a surface of the protection board, the method further includes: attaching a surface of an upper cover to the light filter layer; and etching another surface of the upper cover to slim down a thickness of the upper cover to a preset second thickness.

In this possible design, after the surface of the upper cover is attached to the light filter layer, the thickness of the upper cover may be slimmed down to the preset second thickness by etching the another surface of the upper cover. In this way, there is no need to purchase an upper cover of a specified thickness, reducing production costs of the display panel.

BRIEF DESCRIPTION OF DRAWINGS

FIG. 12 is a first flowchart of a display panel production method according to an embodiment of the present invention;

FIG. 13 is a schematic flowchart of a single-surface slimming process according to an embodiment of the present invention;

FIG. 14 is a second flowchart of a display panel production method according to an embodiment of the present invention.

DESCRIPTION OF EMBODIMENTS

When an AMOLED display panel emits light, a voltage is applied to an anode layer and a cathode layer, so that an organic light-emitting component (namely, an AMOLED) between the anode layer and the cathode layer emits red light, green light, and blue light of different intensity based on a value of the voltage. Because the cathode layer is a metal, after ambient light outside the display panel is incident on the display panel, the metal of the cathode layer reflects the ambient light, increasing dark state brightness of the display panel in a bright environment. Consequently, a contrast of the display panel in the bright environment decreases.

Figure 1:
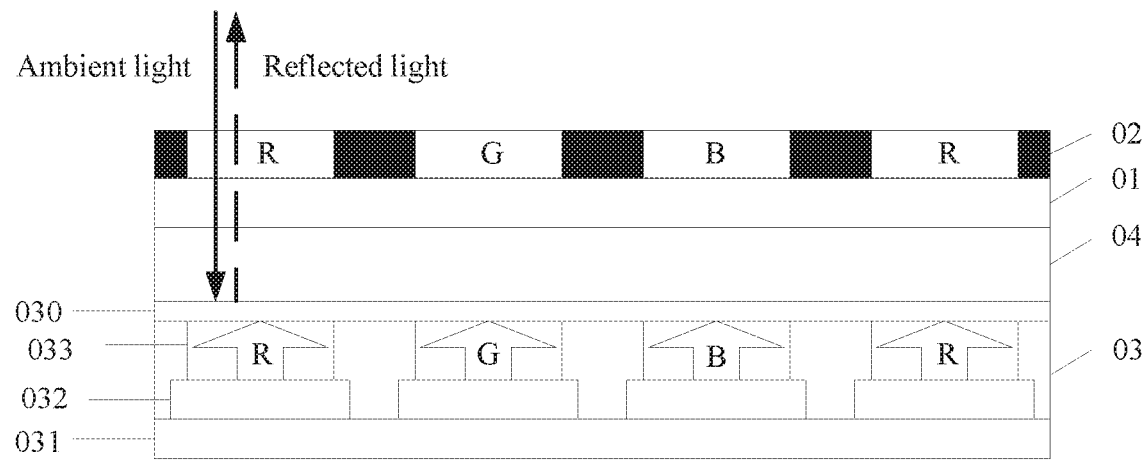
FIG. 1 is a schematic diagram of a display panel according to the prior art.
Figure 2:
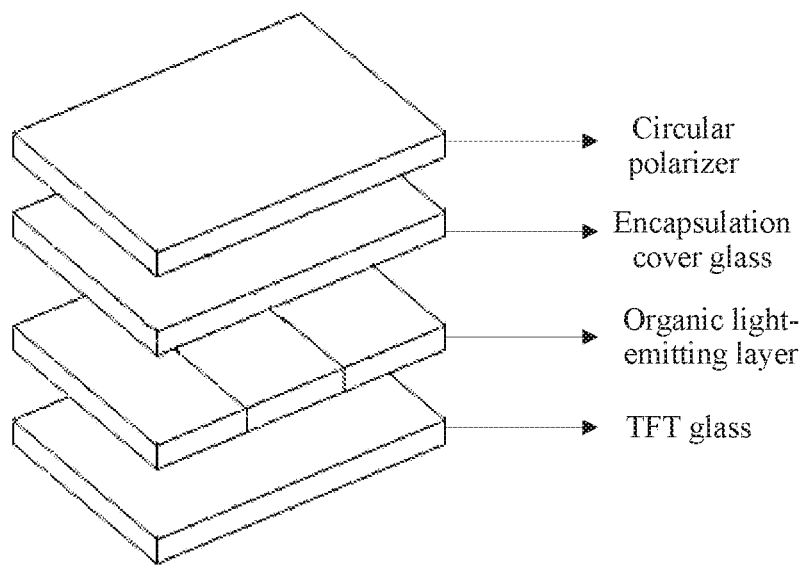
FIG. 2 is a schematic diagram of another display panel according to the prior art.

Currently, to eliminate ambient light reflection, a circular polarizer is usually disposed in the display panel. As shown in FIG. 2, a display panel includes a circular polarizer, encapsulation cover glass (Encap Glass), an organic light-emitting layer, and thin film transistor (Thin Film Transistor, TFT) glass. The organic light-emitting layer is usually disposed on the TFT glass, and the encapsulation cover glass is used for protecting the organic light-emitting layer. The organic light-emitting layer includes an anode layer, a cathode layer, and an organic light-emitting component.

The circular polarizer usually includes a linear polarizer and a ¼-phase compensation film. The linear polarizer can transmit polarized light vibrating in a direction (assumed to be a direction x), and the ¼-phase compensation film can increase a phase of light passing through the ¼-phase compensation film by a ¼ wavelength. It may be understood that ambient light may be considered as light obtained through superposition of two parts of polarized light with a same amplitude and perpendicular vibration directions (in other words, with a phase difference of half a wavelength). Therefore, when the ambient light passes through the linear polarizer, polarized light vibrating in the direction x passes, polarized light vibrating in a direction y is filtered out, and light intensity is reduced to 50%. When the polarized light vibrating in the direction x passes through the ¼-phase compensation film, a phase increases by a ¼ wavelength. Further, when the polarized light is reflected by a metal of the cathode layer and then passes through the ¼-phase compensation film again, the phase increases by another ¼ wavelength. In other words, the polarized light vibrating in the direction x is incident on the display panel by using the linear polarizer, and the phase of the polarized light increases by half a wavelength after the polarized light passes through the ¼-phase compensation film twice. Therefore, the vibration direction changes to the direction y perpendicular to the direction x. Therefore, the polarized light that enters the display panel and whose vibration direction is changed to y is restricted within the linear polarizer, and the polarized light cannot exit the display panel, eliminating ambient light reflection.

However, light emitted by the organic light-emitting layer may also be considered as light obtained through superposition of two parts of polarized light with a same amplitude and perpendicular vibration directions. In addition, a circular polarizer is added to a light-emitting side of the organic light-emitting layer. Therefore, light intensity of the light emitted by the organic light-emitting layer is also reduced by 50%. As a result, power consumed needs to be doubled to ensure intensity of the light emitted by the display panel.

This application provides a display panel, so that ambient light reflection is reduced by using a color light filter and a diffusion film, and no circular polarizer needs to be disposed, reducing power consumption.

In the descriptions of the embodiments of the present invention, it should be understood that directions or position relationships indicated by the terms "center", "up", "down", "front", "rear", "left", "right", "perpendicular", "horizontal", "top", "bottom", "inside", "outside", and the like are based on the directions or position relationships shown in the accompanying drawings, and are merely intended to describe the technical solutions in the embodiments of the present invention and simplify the descriptions, but are not intended to indicate or imply that an apparatus or a component shall have a specific direction or be constructed and operated in a specific direction, and therefore shall not be understood as a limitation on the embodiments of the present invention.

The terms "first" and "second" are merely intended for a purpose of description, and shall not be understood as an indication or implication of relative importance or implicit indication of a quantity of indicated technical features. Therefore, a feature restricted by "first" or "second" may explicitly indicate or implicitly include one or more such features. In the descriptions in the embodiments of the present invention, unless otherwise provided, "a plurality of" means two or more than two.

Figure 3:
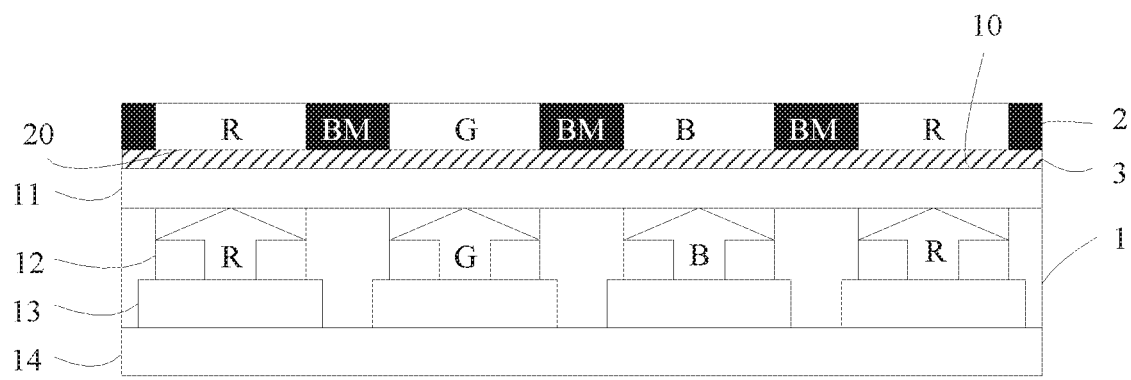
FIG. 3 is a first schematic diagram of a display panel according to an embodiment of the present invention.
Figure 4:
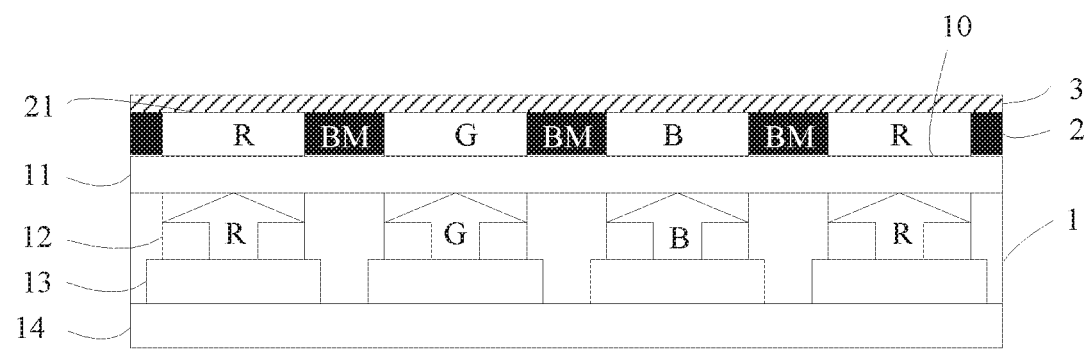
FIG. 4 is a second schematic diagram of a display panel according to an embodiment of the present invention.
Figure 5:
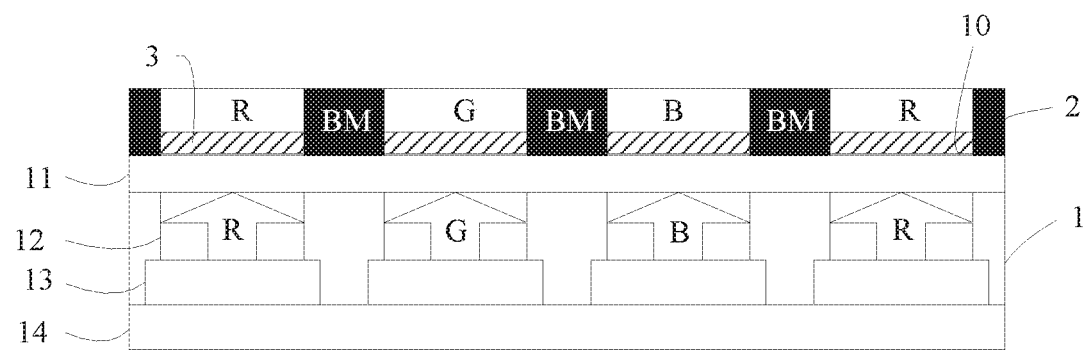
FIG. 5 is a third schematic diagram of a display panel according to an embodiment of the present invention.

FIG. 3 to FIG. 5 show a display panel provided in an embodiment of the present invention. The display panel includes an AMOLED light-emitting board 1 and a light filter layer disposed on a cathode surface 10 of the AMOLED light-emitting board 1. The light filter layer includes a color light filter 2 and a diffusion film 3. The color light filter 2 includes a red light filter component (for example, a region marked with R in the color light filter 2 shown in FIG. 3 to FIG. 5) transmitting red light, a green light filter component (for example, a region marked with G in the color light filter 2 shown in FIG. 3 to FIG. 5) transmitting green light, a blue light filter component (for example, a region marked with B in the color light filter 2 shown in FIG. 3 to FIG. 5) transmitting blue light, and a black matrix (Black Matrix, BM) (for example, a region marked with BM in the color light filter 2 shown in FIG. 3 to FIG. 5).

As shown in FIG. 3 or FIG. 4, the diffusion film 3 is disposed on a surface of the color light filter 2; or as shown in FIG. 5, the diffusion film 3 is disposed on each light filter component in the color light filter 2.

The diffusion film 3 is configured to enable ambient light passing through the diffusion film 3 to be incident on the cathode surface 10 of the AMOLED light-emitting board 1 in a direction that is not perpendicular to the cathode surface 10 of the AMOLED light-emitting board 1, so that the ambient light is reflected by the cathode surface 10 of the AMOLED light-emitting board 1 to the BM or a light filter component that has a different color from a light filter component through which the ambient light passes.

It may be understood that a light filter component in the color light filter can transmit only light that has a same color as the light filter component and absorb light that has a different color from the light filter component, and the BM is not transparent. Therefore, when the ambient light is reflected to the BM or the light filter component that has a different color from the light filter component through which the ambient light passes when being incident on the display panel, the ambient light can be absorbed by the BM or the light filter component of the different color, reducing reflection of the ambient light incident on the display panel, and increasing a contrast of the display panel in a bright environment.

It should be noted that in this embodiment of the present invention, in FIG. 3 to FIG. 5, an example in which the AMOLED light-emitting board 1 includes a cathode layer 11, an organic light-emitting component 12, an anode layer 13, and a base 14 is used for illustration. The anode layer 13 is disposed on the base 14, and the organic light-emitting component 12 is disposed between the anode layer 13 and the cathode layer 11. The organic light-emitting component 12 includes a structure emitting red light, green light, and blue light (regions respectively marked with R, G, and B in the organic light-emitting component 12 shown in FIG. 3 to FIG. 5) after a voltage is applied between the anode layer 13 and the cathode layer 11, and the structure emitting light of different colors is referred to as pixels.

It may be understood that sizes, a quantity, and an arrangement manner of light filter components of each color in the color light filter 2 are the same as sizes, a quantity, and an arrangement manner of pixels of the corresponding color in the AMOLED light-emitting board 1.

In this embodiment of the present invention, the diffusion film 3 may be a separate layer of structure in the display panel, and may be disposed on a surface 20 of the light filter 2 (as shown in FIG. 3) or disposed on a surface 21 of the color light filter 2 (as shown in FIG. 4).

Alternatively, the diffusion film 3 may be built into the color light filter 2 as a partial structure of the color light filter 2, in other words, each light filter component in the color light filter 2 is covered by one layer of diffusion film 3. For example, one layer of diffusion film 3 is disposed on a lower surface of each light filter component in the color light filter 2 (as shown in FIG. 5).

It should be noted that the diffusion film disposed in the display panel provided in this embodiment of the present invention can change light intensity of various scattering angles through design (for example, design of material composition of the diffusion film, or structure design). In other words, in this embodiment of the present invention, through design of the diffusion film, light intensity of light scattered in a direction can be the highest, and light intensity of light scattered in other directions may be ignored.

Figure 6:
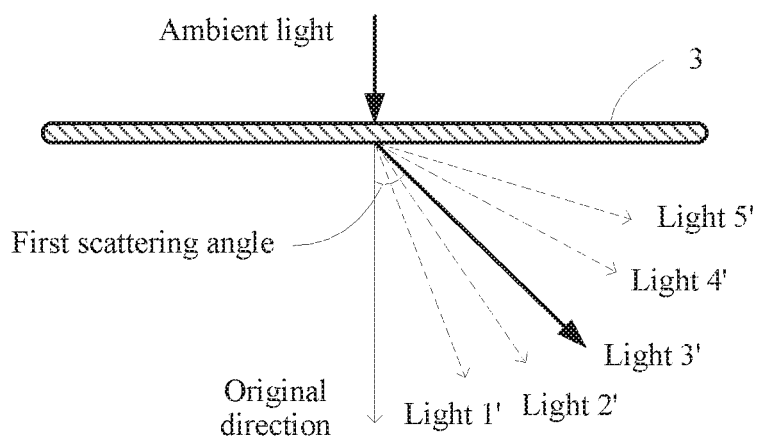
FIG. 6 is a schematic diagram of various scattering angles of a diffusion film according to an embodiment of the present invention.

For example, when ambient light passes through the diffusion film, the ambient light is scattered in a plurality of directions. As a scattering angle increases, light intensity of scattered light first increases and then decreases. In other words, after the ambient light passes through the diffusion film, light intensity of light scattered from various scattering angles does not monotonically decrease or monotonically increase with an increase of the scattering angle, and light intensity of scattered light is the highest from a scattering angle. For example, as shown in FIG. 6, when ambient light passes through the diffusion film 3, light intensity of light 3' scattered from a first scattering angle is the highest, light intensity of light 1' is less than light intensity of light 2', the light intensity of the light 2' is less than the light intensity of the light 3', light intensity of light 4' is less than the light intensity of the light 3', and light intensity of light 5' is less than the light intensity of the light 4'.

In this embodiment of the present invention, a scattering angle of light scattered by the diffusion film that has highest light intensity may be referred to as the first scattering angle of the diffusion film. A value of the first scattering angle is designed, so that the ambient light passing through the diffusion film can be incident on the cathode surface of the AMOLED light-emitting board in a direction that is not perpendicular to the cathode surface of the AMOLED light-emitting board. In this way, the ambient light can be reflected by the cathode surface of the AMOLED light-emitting board to the BM or the light filter component that has a different color from the light filter component through which the ambient light passes.

Figure 7:
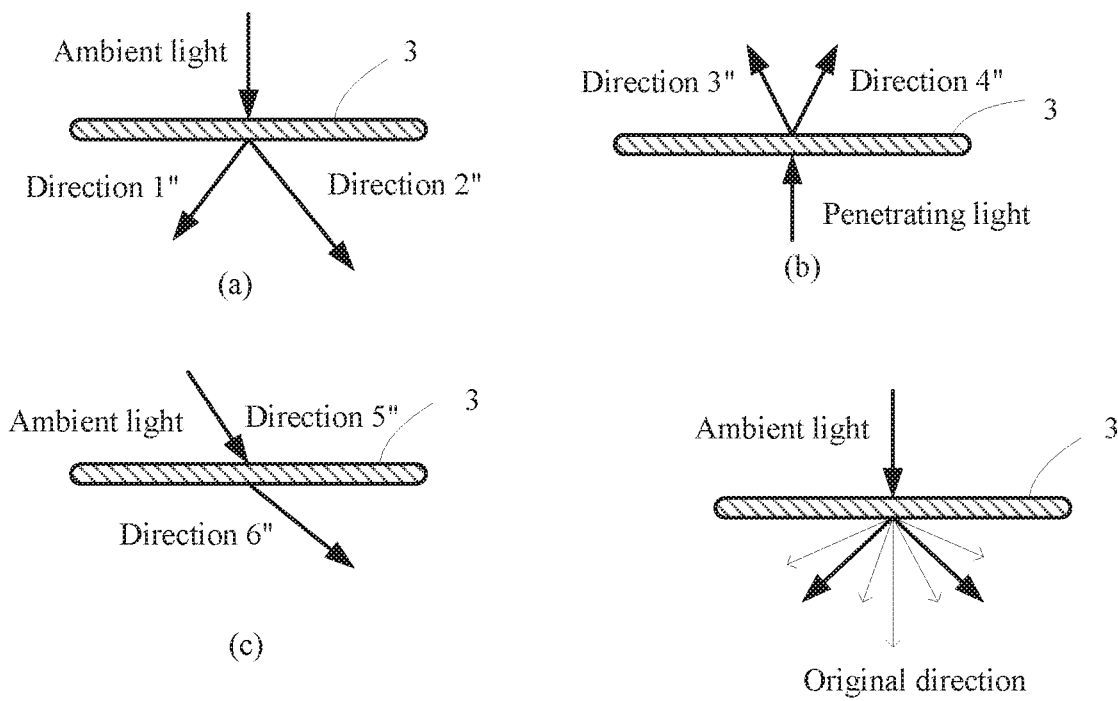
FIG. 7 is a schematic diagram of a first scattering angle of a diffusion film according to an embodiment of the present invention.

For example, design of the first scattering angle of the diffusion film 3 provided in this embodiment of the present invention may be shown in FIG. 7. Specifically, as shown in (a) in FIG. 7, if ambient light outside the display panel is perpendicularly incident on the diffusion film 3, after passing through the diffusion film 3, the ambient light is scattered, according to the first scattering angle of the diffusion film 3, in a direction 1' or a direction 2" that is not perpendicular to the diffusion film. As shown in (b) in FIG. 7, in the display panel, if penetrating light emitted by the AMOLED light-emitting board is perpendicularly incident on the diffusion film 3, after passing through the diffusion film 3, the penetrating light is scattered, according to the first scattering angle of the diffusion film 3, in a direction 3" or a direction 4" that is not perpendicular to the diffusion film 3. As shown in (c) in FIG. 7, if ambient light outside the display panel is not perpendicularly incident on the diffusion film 3 but is incident on the diffusion film 3 in, for example, a direction 5", after passing through the diffusion film 3, the ambient light is scattered, according to the first scattering angle of the diffusion film 3, in a direction that is not perpendicular to the diffusion film 3. For example, after passing through the diffusion film 3, the ambient light is scattered in a direction 6".

Further, in this embodiment of the present invention, the first scattering angle of the diffusion film may be designed based on a width (equal to a pixel width) of each light filter component in the color light filter and a distance between the color light filter and the cathode surface of the AMOLED light-emitting board.

Figure 8:
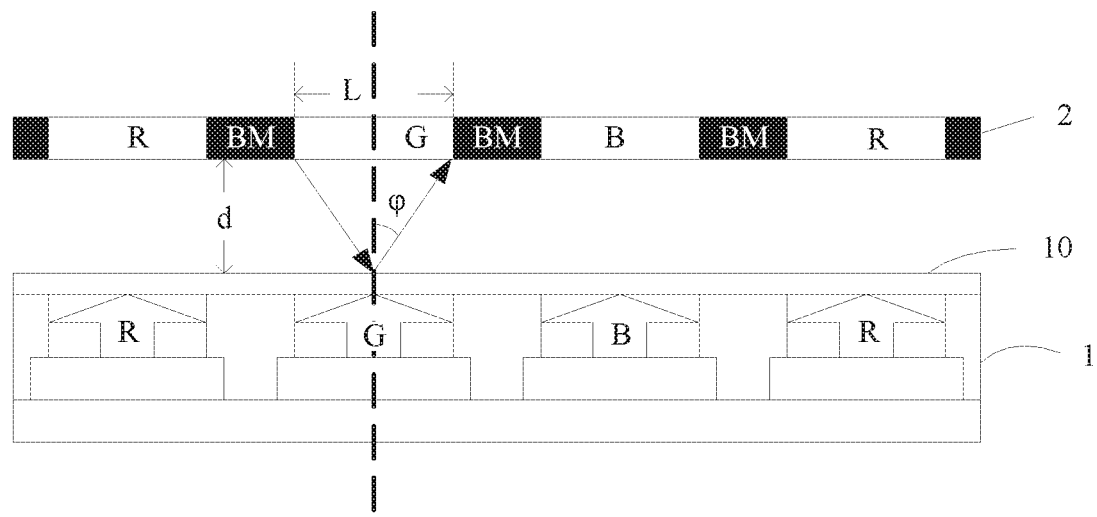
FIG. 8 is a schematic diagram of a reflection principle of a display panel according to an embodiment of the present invention.

For example, a reflection principle of the display panel is shown in FIG. 8. It is assumed that a width of each light filter component in the color light filter 2 is L, and a distance between the color light filter and the cathode surface 10 of the AMOLED light-emitting board 1 is d. After passing through a light filter component (for example, a green light filter component marked with G in FIG. 8), ambient light is incident on the cathode surface 10 of the AMOLED light-emitting board 1, and is reflected, a maximum reflection angle of the light emitted from the green light filter component is $\varphi$. It can be deduced that $\tan \varphi = L/2d$. When a reflection angle of ambient light incident on the cathode surface 10 of the AMOLED light-emitting board 1 is greater than $\varphi$, the ambient light may be reflected to the BM of the color light filter 2, or be reflected to a light filter component that has a different color from a green light filter component through which the ambient light passes when being incident on the display panel, and is absorbed by the light filter component of the different color.

Based on the foregoing reflection principle, in this embodiment of the present invention, the first scattering angle of the diffusion film may be designed based on values of L and d actually required for display panel production. In other words, after $\varphi$ is calculated based on L and d, the first scattering angle of the diffusion film is designed as an angle greater than $\varphi$. In this case, after the ambient light is scattered by the diffusion film and scattered light with highest light intensity is reflected by the cathode surface of the AMOLED light-emitting board, a reflection angle is greater than $\varphi$, so that the light with the highest light intensity can be reflected to the BM of the color light filter or the light filter component of the different color, and is absorbed by the light filter component of the different color, reducing ambient light reflection.

For example, the diffusion film may be a holographic diffusion film. It should be noted that, after ambient light is scattered by the holographic diffusion film, scattering angles of the ambient light in different directions may be different, in other words, the light passing through the holographic diffusion film is anisotropic. Therefore, in this embodiment of the present invention, a scattering effect of the ambient light can be improved by using the holographic diffusion film, further reducing reflection of the ambient light incident on the display panel.

Figure 9:
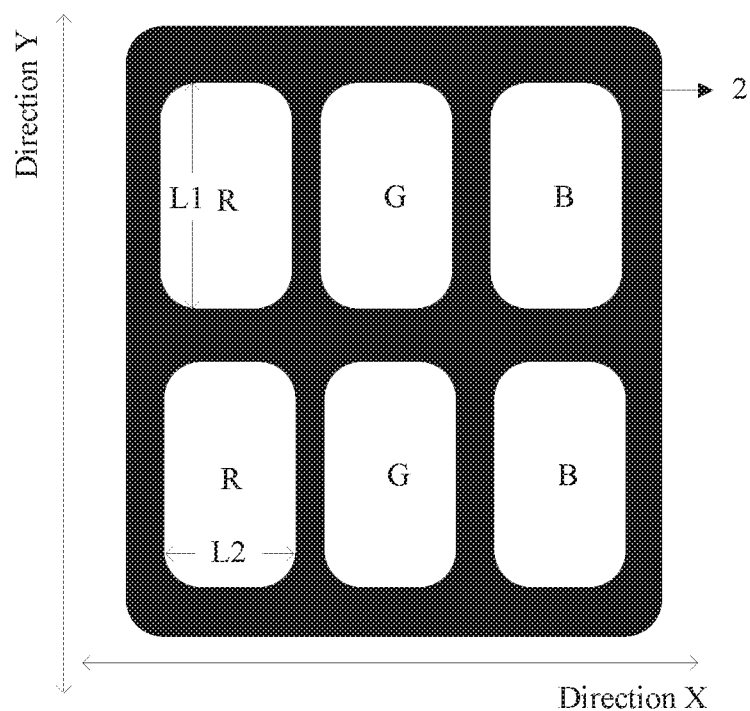
FIG. 9 is a schematic arrangement diagram of a light filter component in a color light filter according to an embodiment of the present invention.

For example, as shown in FIG. 9, when red light filter components (regions marked with R in FIG. 9), green light filter components (regions marked with G in FIG. 9) and blue light filter components (regions marked with B in FIG. 9) are arranged in a stripe (stripe) arrangement manner, because a width (assumed to be L2) of a light filter component of each color in a direction X is different from a width (assumed to be L1) of the light filter component in a direction Y, calculated $\varphi$ varies when d remains unchanged. It is assumed that when $L=L1$, $\varphi=\varphi1$, and when $L=L2$, $\varphi=\varphi2$. In this case, in this embodiment of the present invention, the holographic diffusion film is used, a first scattering angle of the holographic diffusion film in the direction X is designed to be greater than $\varphi2$, and a first scattering angle of the holographic diffusion film in the direction Y is designed to be greater than $\varphi1$, so that when light perpendicularly passes through the holographic diffusion film and is scattered in different directions, the first scattering angle varies. This ensures that light that is perpendicularly incident on the display panel, scattered by the holographic diffusion film, and reflected by the cathode surface of the AMOLED light-emitting board can be incident on the BM or a light filter component of another color.

Optionally, the diffusion film may be a prism film, or another film that can be used to control the first scattering angle. This is not limited in this embodiment of the present invention.

Further, to avoid an excessively large thickness of the display panel, the distance d between the color light filter and the cathode surface of the AMOLED light-emitting board may be designed to range from 0.1 millimeter to 0.3 millimeter.

Figure 10:
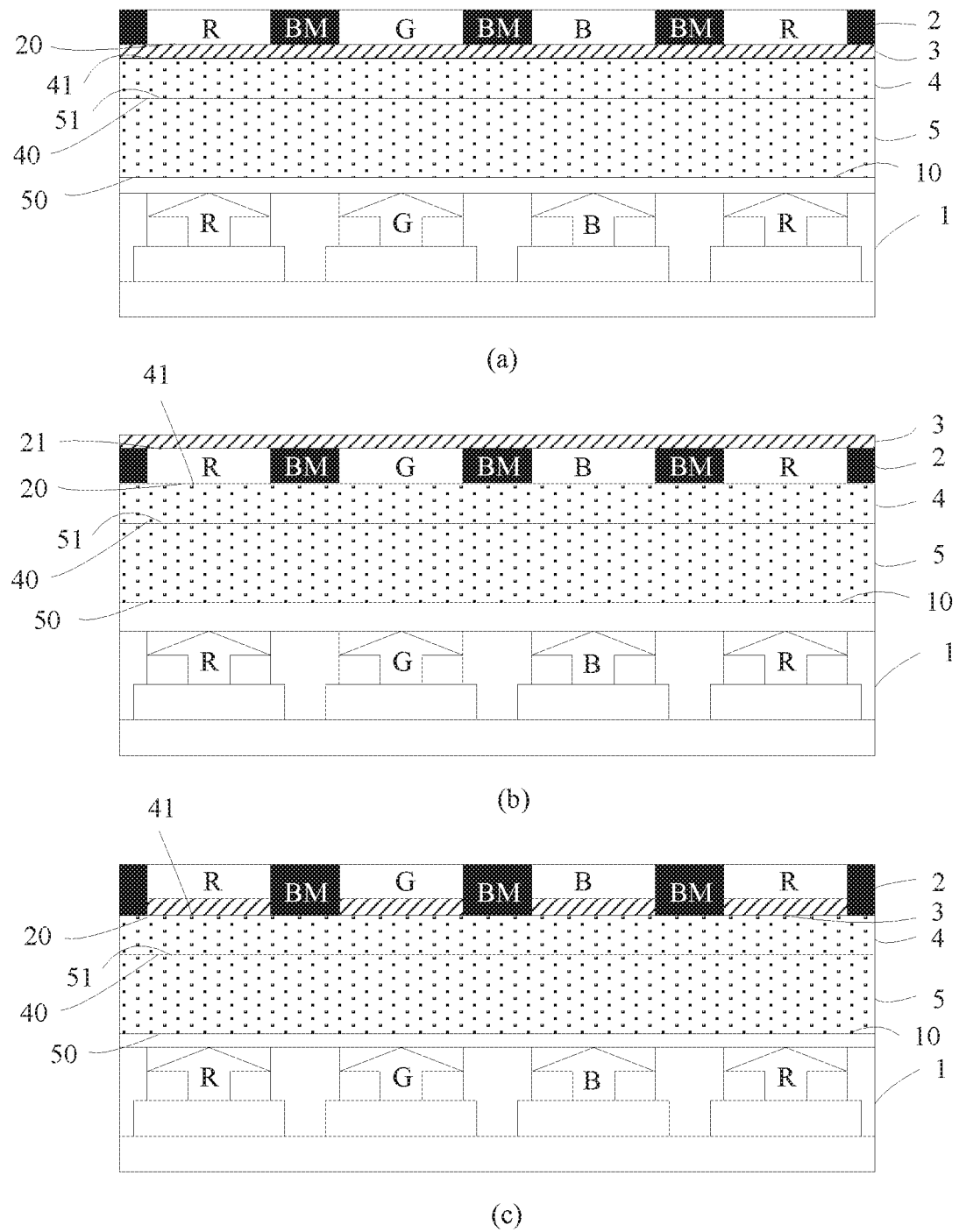
FIG. 10 is a fourth schematic diagram of a display panel according to an embodiment of the present invention.

For example, with reference to FIG. 3 to FIG. 5, as shown in FIG. 10, the display panel further includes a substrate 4 and a protection board 5 that are located between the cathode surface 10 of the AMOLED light-emitting board 1 and the light filter layer. The light filter layer is disposed on a surface 41 of the substrate 4, another surface 40 of the substrate 4 is attached to a surface 51 of the protection board 5, and another surface 50 of the protection board 5 is attached to the cathode surface 10 of the AMOLED light-emitting board 1.

It may be understood that, in this embodiment of the present invention, the surface 50 and the surface 51 of the protection board 5 are two opposite surfaces with a largest area among surfaces of the protection board 5. The surface 40 and the surface 41 of the substrate 4 are two opposite surfaces with a largest area among surfaces of the substrate 4.

Based on the structure shown in FIG. 3, as shown in (a) in FIG. 10, the diffusion film 3 may be disposed between the surface 20 of the color light filter 2 and the surface 41 of the substrate 4. Based on the structure shown in FIG. 4, as shown in (b) in FIG. 10, the surface 20 of the color light filter 2 is attached to the surface 41 of the substrate 4, and the diffusion film 3 may be disposed on the surface 21 of the color light filter 2. Based on the structure shown in FIG. 5, as shown in (c) in FIG. 10, the surface 20 of the color light filter 2 is attached to the surface 41 of the substrate 4, and a lower surface of each light filter component in the color light filter 2 is covered by one layer of diffusion film 3.

A sum of a thickness of the protection board and a thickness of the substrate ranges from 0.1 millimeter to 0.3 millimeter.

Figure 11:
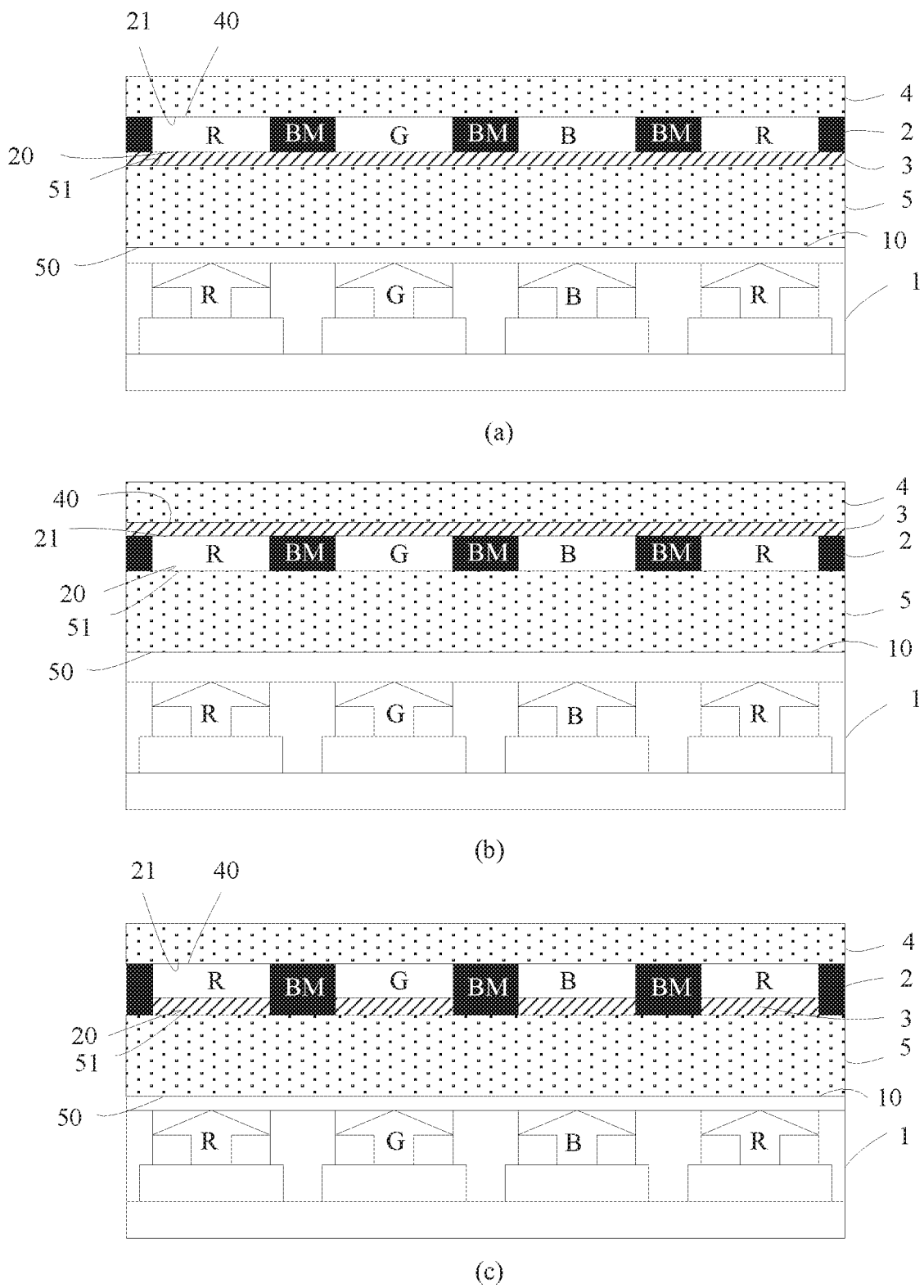
FIG. 11 is a fifth schematic diagram of a display panel according to an embodiment of the present invention.

For example, with reference to FIG. 3 to FIG. 5, as shown in FIG. 11, the display panel further includes a substrate 4 located on a surface of the light filter layer and a protection board 5 located between another surface of the light filter layer and the cathode surface 10 of the AMOLED light-emitting board 1.

Based on the structure shown in FIG. 3, as shown in (a) in FIG. 11, a surface 40 of the substrate 4 is attached to the surface 21 of the color light filter 2, the diffusion film 3 may be disposed between the surface 20 of the color light filter 2 and a surface 51 of the protection board 5, and a surface 50 of the protection board 5 is attached to the cathode surface 10 of the AMOLED light-emitting board 1. Based on the structure shown in FIG. 4, as shown in (b) in FIG. 11, the diffusion film 3 is disposed between the surface 21 of the color light filter 2 and the surface 40 of the substrate 4, the surface 20 of the color light filter 2 is attached to the surface 51 of the protection board 5, and the surface 50 of the protection board 5 is attached to the cathode surface 10 of the AMOLED light-emitting board 1. Based on the structure shown in FIG. 5, as shown in (c) in FIG. 11, the surface 21 of the color light filter 2 is attached to the surface 40 of the substrate 4, a lower surface of each light filter component in the color light filter 2 is covered by one layer of diffusion film 3, the surface 20 of the color light filter 2 is attached to the surface 51 of the protection board 5, and the surface 50 of the protection board 5 is attached to the cathode surface 10 of the AMOLED light-emitting board 1.

A thickness of the protection board ranges from 0.1 millimeter to 0.3 millimeter.

Optionally, materials of the substrate and the protection board may also be glass or transparent plastic materials, such as transparent plastic. For example, the substrate may be TFT glass, and the protection board is encapsulation cover glass.

Based on the display panel provided in this embodiment of the present invention, the diffusion film is disposed on the color light filter, so that after passing through the diffusion film, the ambient light incident on the display panel can be scattered in a direction that is not perpendicular to the AMOLED display panel. In this case, the ambient light is incident on the cathode surface of the AMOLED light-emitting board of the display panel from a specific scattering angle instead of being perpendicularly incident on the cathode surface of the AMOLED light-emitting board, so that the ambient light is reflected by the cathode surface of the AMOLED light-emitting board to the BM or the light filter component that has a different color from the light filter component through which the ambient light passes. A light filter component in the color light filter can transmit only light that has a same color as the light filter component and absorb light that has a different color from the light filter component, and the BM is not transparent. Therefore, when the ambient light is reflected to the BM or the light filter component that has a different color from the light filter component through which the ambient light passes when being incident on the display panel, the ambient light can be absorbed by the BM or the light filter component of the different color, reducing reflection of the ambient light incident on the display panel, and increasing a contrast of the display panel in a bright environment.

As shown in FIG. 12, an embodiment of the present invention further provides a display panel production method, and the method may include the following steps.

S101. Dispose a light filter layer on a surface of a substrate. The light filter layer includes a color light filter and a diffusion film. The color light filter includes a red light filter component transmitting red light, a green light filter component transmitting green light, a blue light filter component transmitting blue light, and a black matrix BM. The diffusion film is disposed on a surface of the color light filter, or the diffusion film is disposed on each light filter component in the color light filter, so that the ambient light is reflected by a cathode surface of the AMOLED light-emitting board to the BM or a light filter component that has a different color from a light filter component through which the ambient light passes.

For example, for specific design of the color light filter and the diffusion film in the light filter layer, refer to descriptions in the embodiment shown in FIG. 3 and FIG. 4, Details are not described herein again.

S102. Each another surface of the substrate to slim down a thickness of the substrate to a preset first thickness.

For example, as shown in FIG. 13, it is assumed that a current thickness of the substrate is 200 micrometers, and the required first thickness is 30 micrometers. After the color light filter is produced on the surface of the substrate, the another surface of the transparent substrate may be etched in a single-surface slimming manner, to reduce 200 micrometers to 30 micrometers. The surface and the another surface of the substrate are opposite surfaces with a largest area among surfaces of the substrate.

It may be understood that after the light filter layer is disposed on the surface of the substrate, the thickness of the substrate is slimmed down to the first thickness by etching the another surface of the substrate. In this way, there is no need to purchase a substrate of the first thickness to produce a display panel, reducing costs of the display panel.

S103. Attach the etched another surface of the substrate to a surface of the protection board.

S104. Attach another surface of the protection board to the cathode surface of the AMOLED light-emitting board.

A sum of a thickness of the protection board and the first thickness ranges from 0.1 millimeter to 0.3 millimeter.

For example, it is assumed that the thickness of the protection board is set to 120 micrometers, and the first thickness may be determined as 30 micrometers according to a requirement that the sum of the thickness of the protection board and the first thickness ranges from 0.1 millimeter to 0.3 millimeter.

It should be noted that a process of S101 and S102 and a process of S103 may be simultaneously performed, or may be sequentially performed, and an execution sequence is not limited.

An upper cover may be further disposed on the light filter layer. For example, after S101 and before S102, as shown in FIG. 14, the method further includes:

S105. Attach a surface of an upper cover to the light filter layer.

S106. Etch another surface of the upper cover to slim down a thickness of the upper cover to a preset second thickness.

The surface and the another surface of the upper cover are opposite surfaces with a largest area among surfaces of the substrate.

Figure 15:
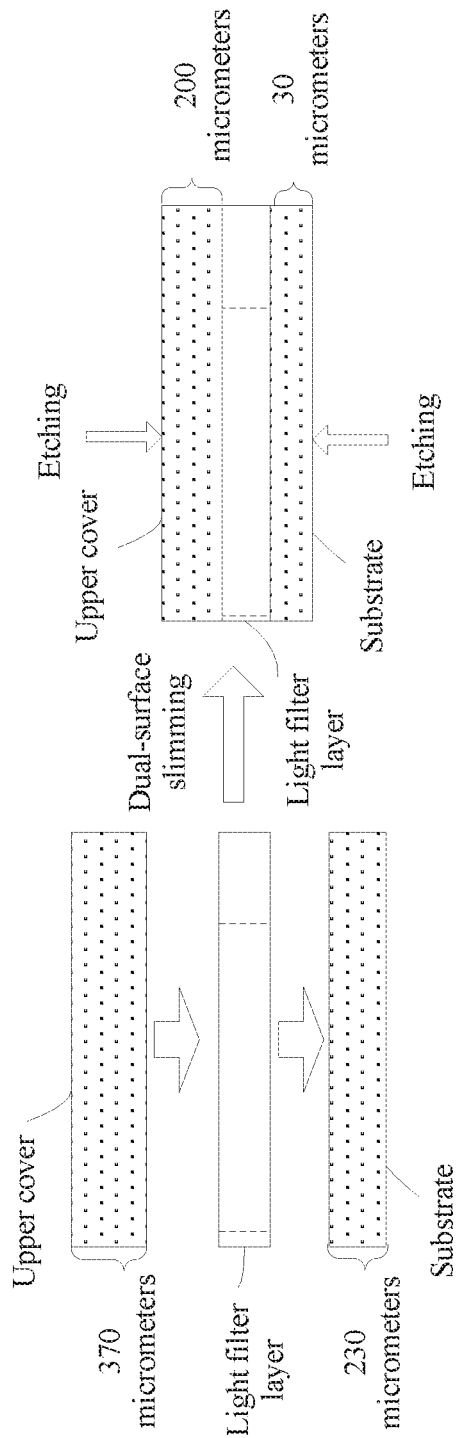
FIG. 15 is a schematic flowchart of a dual-surface slimming process according to an embodiment of the present invention.

For example, it is assumed that a current thickness of the substrate is 230 micrometers, the required first thickness is 30 micrometers, and a current thickness of the upper cover is 370 micrometers. To avoid an excessively large thickness of the display panel, the thickness of the upper cover and the thickness of the substrate may be controlled within a proper range. For example, if the required second thickness is 200 micrometers, after the light filter layer is disposed between the upper cover and the substrate in processes of S101 and S105, processes of S102 and S106 may be separately performed in a single-surface slimming manner, to slim down the upper cover from 370 micrometers to 200 micrometers, and slim down the substrate from 230 micrometers to 30 micrometers. Alternatively, processes of S102 and S106 may be simultaneously performed in a dual-surface slimming manner. As shown in FIG. 15, the another surface of the upper cover and the another surface of the transparent substrate are simultaneously etched, to slim down the upper cover from 370 micrometers to 200 micrometers, and slim down the transparent substrate from 230 micrometers to 30 micrometers. It may be understood that because the light filter layer is disposed between the substrate and the upper cover, the light filter layer can be prevented from being damaged in a process of etching the another surface of the substrate and the another surface of the upper cover.

Based on the display panel production method provided in this embodiment of the present invention, after the light filter layer is disposed on the surface of the substrate, the thickness of the substrate is slimmed down to the first thickness by etching the another surface of the substrate. Then the etched another surface of the substrate is attached to the surface of the protection board, and the another surface of the protection board is attached to the cathode surface of the AMOLED light-emitting board, to obtain the display panel. The diffusion film is disposed on the color light filter in the light filter layer, so that after passing through the diffusion film, the ambient light incident on the display panel can be scattered in a direction that is not perpendicular to the AMOLED display panel. In this case, the ambient light is incident on the cathode surface of the AMOLED light-emitting board of the display panel from a specific scattering angle instead of being perpendicularly incident on the cathode surface of the AMOLED light-emitting board, so that the ambient light is reflected by the cathode surface of the AMOLED light-emitting board to the BM or the light filter component that has a different color from the light filter component through which the ambient light passes. A light filter component in the color light filter can transmit only light that has a same color as the light filter component and absorb light that has a different color from the light filter component, and the BM is not transparent. Therefore, when the ambient light is reflected to the BM or the light filter component that has a different color from the light filter component through which the ambient light passes when being incident on the display panel, the ambient light can be absorbed by the BM or the light filter component of the different color, reducing reflection of the ambient light incident on the display panel, and increasing a contrast of the display panel in a bright environment.

An embodiment of the present invention further provides a display apparatus, including the display panel shown in FIG. 3, FIG. 4, FIG. 6, or FIG. 8.

In the display apparatus provided in this embodiment of the present invention, a diffusion film is disposed on a color light filter of a display panel in the display apparatus, so that after passing through the diffusion film, ambient light incident on the display panel can be scattered in a direction that is not perpendicular to the AMOLED display panel. In this way, the ambient light is incident on a cathode surface of an AMOLED light-emitting board of the display panel from a specific scattering angle instead of being perpendicularly incident to the cathode surface of the AMOLED light-emitting board. In this way, after being reflected by the cathode surface of the AMOLED light-emitting board, the ambient light can be incident on a BM of the color light filter, or be incident on a light filter component that has a different color from a light filter component through Which the ambient light passes when being incident on the display panel, and is absorbed by the light filter component of the different color, reducing reflection of the ambient light incident on the display panel, and increasing a contrast of the display panel in a bright environment.

The descriptions are only specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A display panel, comprising:
    an active matrix organic light-emitting diode (AMOLED) light-emitting board comprising a first surface; and
    a light filter layer disposed on the first surface and comprising:
        a color light filter comprising:
            a second surface;
            a red light filter component configured to pass red light;
            a green light filter component configured to pass green light;
            a blue light filter component configured to pass blue light; and
            a black matrix (BM); and
        a diffusion film disposed on the second surface and configured to allow ambient light to pass through the diffusion film to the first surface in a direction that is not perpendicular to the first surface, wherein the color light filter is between the diffusion film and the first surface.

2. The display panel of claim 1, wherein the diffusion film is a holographic diffusion film.

3. The display panel of claim 1, further comprising:
    a substrate located between the first surface and the color light filter; and
    a protection board located between the first surface and the color light filter,
    wherein the light filter layer is disposed on a third surface of the substrate, wherein a fourth surface of the substrate is attached to a fifth surface of the protection board, wherein a sixth surface of the protection board is attached to the first surface, and wherein a sum of a thickness of the protection board and a thickness of the substrate is within a range of 0.1 millimeter to 0.3 millimeter.

4. The display panel of claim 1, further comprising:
    a substrate located on a seventh surface of the light filter layer; and
    a protection board located between a eighth surface of the light filter layer and the first surface, wherein a thickness of the protection board is within a range of 0.1 millimeter to 0.3 millimeter.

5. The display panel of claim 4, wherein the substrate and the protection board are made of glass or transparent plastic materials.

6. The display panel of claim 1, wherein the diffusion film is disposed on the red light filter component, the blue light filter component and the green light filter component.

7. The display panel of claim 1, wherein the first surface is configured to reflect the ambient light to the BM.

8. The display panel of claim 1, wherein the first surface is configured to reflect the ambient light to a light filter component that is different than a light filter component through which the ambient light passes.

9. An electronic device, comprising:
    a display panel comprising:
        an active matrix organic light-emitting diode (AMOLED) light-emitting board comprising a first surface; and
        a light filter layer disposed on the first surface and comprising:
            a color light filter comprising:
                a second surface;
                a red light filter component configured to pass red light;
                a green light filter component configured to pass green light;
                a blue light filter component configured to pass blue light; and
                a plurality of black matrix (BM) components; and
            a diffusion film disposed on the red light filter component, the green light filter component, and the blue light filter component, wherein a first section of the diffusion film is disposed between adjacent BM components of the plurality of BM components, and wherein the diffusion film is configured to enable ambient light passing through the diffusion film to be incident on the first surface in a direction that is not perpendicular to the first surface.

10. The display panel of claim 9, wherein the diffusion film is a holographic diffusion film.

11. The display panel of claim 9, wherein the display panel further comprises:
a substrate; and
a protection board coupled to the substrate, wherein the substrate and the protection board are located between the first surface and the color light filter,
wherein the light filter layer is disposed on a third surface, wherein a fourth surface of the substrate is attached to a fifth surface of the protection board, wherein a sixth surface of the protection board is attached to the first surface, and wherein a sum of a thickness of the protection board and a thickness of the substrate is within a range of 0.1 millimeter to 0.3 millimeter.

12. The display panel of claim 9, wherein the display panel further comprises:
a substrate located on a seventh surface of the light filter layer; and
a protection board located between an eighth surface of the light filter layer and the first surface, wherein a thickness of the protection board is within a range of 0.1 millimeter to 0.3 millimeter.

13. The display panel of claim 12, wherein the substrate and the protection board are made of glass or transparent plastic materials.

14. The display panel of claim 9, wherein the diffusion film is disposed on the red light filter component, the blue light filter component and the green light filter component.

15. The display panel of claim 9, wherein the first surface is configured to reflect the ambient light to at least one of the plurality of BM components.

16. The display panel of claim 9, wherein the first surface is configured to reflect the ambient light to a light filter component that is different than the light filter component through which the ambient light passes.

17. A display panel production method, comprising:
disposing a light filter layer on a first surface of a substrate, wherein the light filter layer comprises:
a color light filter comprising:
a second surface;
a red light filter component configured to pass red light;
a green light filter component configured to pass green light;
a blue light filter component configured to pass blue light; and
a black matrix BM; and
a diffusion film disposed on the second surface or on the red light filter component, the green light filter component, the blue light filter component, and the BM of the color light filter, wherein the diffusion film is configured to enable ambient light passing through the diffusion film to be incident on a third cathode surface of an active matrix organic light-emitting diode (AMOLED) light-emitting board in a direction that is not perpendicular to the third surface;
etching a fourth surface of the substrate to reduce a thickness of the substrate to a first thickness;
attaching the fourth surface of the substrate to a fifth surface of a protection board, wherein a sum of a thickness of the protection board and the first thickness is within a range of 0.1 millimeter to 0.3 millimeter; and
attaching a sixth surface of the protection board to the third surface.

18. The method of claim 17, further comprising:
attaching a seventh surface of an upper cover to the light filter layer; and
etching an eighth surface of the upper cover to reduce a thickness of the upper cover to a preset second thickness.

19. The method of claim 17, further comprising disposing the diffusion film on the second surface of the color light filter.

20. The method of claim 17, further comprising disposing the diffusion film on the red light filter component, the green light filter component, the blue light filter component, and the BM of the color light filter.

* * * * *